United States Patent

Krausser

[15] 3,701,951

[45] Oct. 31, 1972

[54] DIGITAL INDICATOR FOR USE WITH TUNABLE ELECTRONIC APPARATUS

[72] Inventor: Friedrich Johann Krausser, Jericho, N.Y.

[73] Assignee: Emerson Electric Co., St. Louis, Mo.

[22] Filed: Jan. 5, 1971

[21] Appl. No.: 104,068

[52] U.S. Cl. .................................325/455, 324/79 D

[51] Int. Cl. ..............................................H04b 1/06

[58] Field of Search .325/455; 324/77 D, 78 R, 78 D, 324/79 R, 79 D

[56] References Cited

UNITED STATES PATENTS

| | | | |
|---|---|---|---|
| 2,981,157 | 6/1959 | Hansel | 324/79 R X |
| 2,629,829 | 2/1953 | Daly | 324/79 R X |
| 3,641,434 | 2/1972 | Yates et al. | 325/25 |

*Primary Examiner*—Richard Murray
*Assistant Examiner*—Richard K. Eckert, Jr.
*Attorney*—Darby & Darby

[57] ABSTRACT

A digital tuning indicator for use with tunable electronic apparatus such as FM multiplex receivers includes a harmonic generator which produces a multitude of RF voltages corresponding, respectively, to the frequencies to which the device may be tuned over the frequency band of interest. A mixer or beat generator is responsive to the variable frequency output of the local RF oscillator of the receiver and the harmonic corresponding to the frequency to which the receiver is tuned. A pulse generator coupled to the output of the beat generator produces a pulse when the frequency to which the receiver is tuned approaches the frequency of a station within the frequency band. These pulses are counted by a digital counter which is calibrated to provide a visual indication of the frequency of the station to which the receiver is tuned.

6 Claims, 6 Drawing Figures

INVENTOR.
FRIEDRICH JOHANN KRAUSSER

BY Darby & Darby

ATTORNEYS

DIGITAL INDICATOR FOR USE WITH TUNABLE ELECTRONIC APPARATUS

This invention relates to tuning indicators and, more particularly, to devices for providing a digital indication of the frequency to which an electronic apparatus or device, such as a radio receiver, is tuned.

There are commercially available receivers which employ voltage-variable capacitors (known as varactors) as the means for tuning the equipment. Automatic tuning circuits have been proposed for use with such receivers to provide a variable tuning voltage by simply actuating a switch, as opposed to the usual mechanical dial-type arrangements. An example of such a circuit is disclosed in U. S. patent application Ser. No. 82,400, filed Oct. 20, 1970 in the name of Friedrich Johann Krausser, and entitled AUTOMATIC TUNING CIRCUIT. In the system illustrated and described in that application, a first switch provides continuous advance of the tuner over the frequency band of interest until the switch is released. At that time, the system will tune to the next highest station on the air. The second switch, upon being actuated, causes the receiver to tune automatically to the next highest station. When the receiver is tuned to the highest frequency within the band of interest, actuation of either switch decreases the tuning voltage to a level corresponding to the lowest broadcast frequency within the broadcast band.

Inasmuch as electronic equipment employing varactors does not require mechanical tuning means, the tuning indicators may be electrical devices which, for example, respond to the tuning voltage applied to the varactor. The present invention provides such an indicator. It is a highly accurate and relatively inexpensive circuit for providing a digital indication of the station to which a tunable electronic device is tuned, the invention having particular utility when employed with equipment having varactors or the like as a tuning means.

The present invention, in its preferred embodiment, is intended to be used with a commercial FM multiplex receiver which, in the United States, is adapted to receive FM signals over the frequency band of 88–108 MHz with the individual stations being separated by 200 KHz. Accordingly, in the following specification and in the drawings, these frequencies are used as representative in explaining the invention. The invention is not limited to any particular frequency band, to specific types of signals (e.g. FM or AM), or to receivers. The basic principles of the invention may be employed with other types of tunable electronic devices (e.g. transmitters) including devices which employ mechanical tuning means.

Briefly, in accordance with the invention, a digital tuning indicator includes a harmonic generator which produces harmonics over the entire frequency band of interest, with the harmonics being spaced by a frequency differential corresponding to the spacing between adjacent stations. The frequency to which the device is tuned is coupled to one input of a beat generator, a second input being responsive to the harmonic corresponding to the selected station. The output of the beat generator is coupled to a pulse generator which provides a pulse when the two input signals to the beat generator are close in frequency. When this occurs, the digital counter is stepped to indicate the carrier frequency of the received station.

Figures 1, 3B:
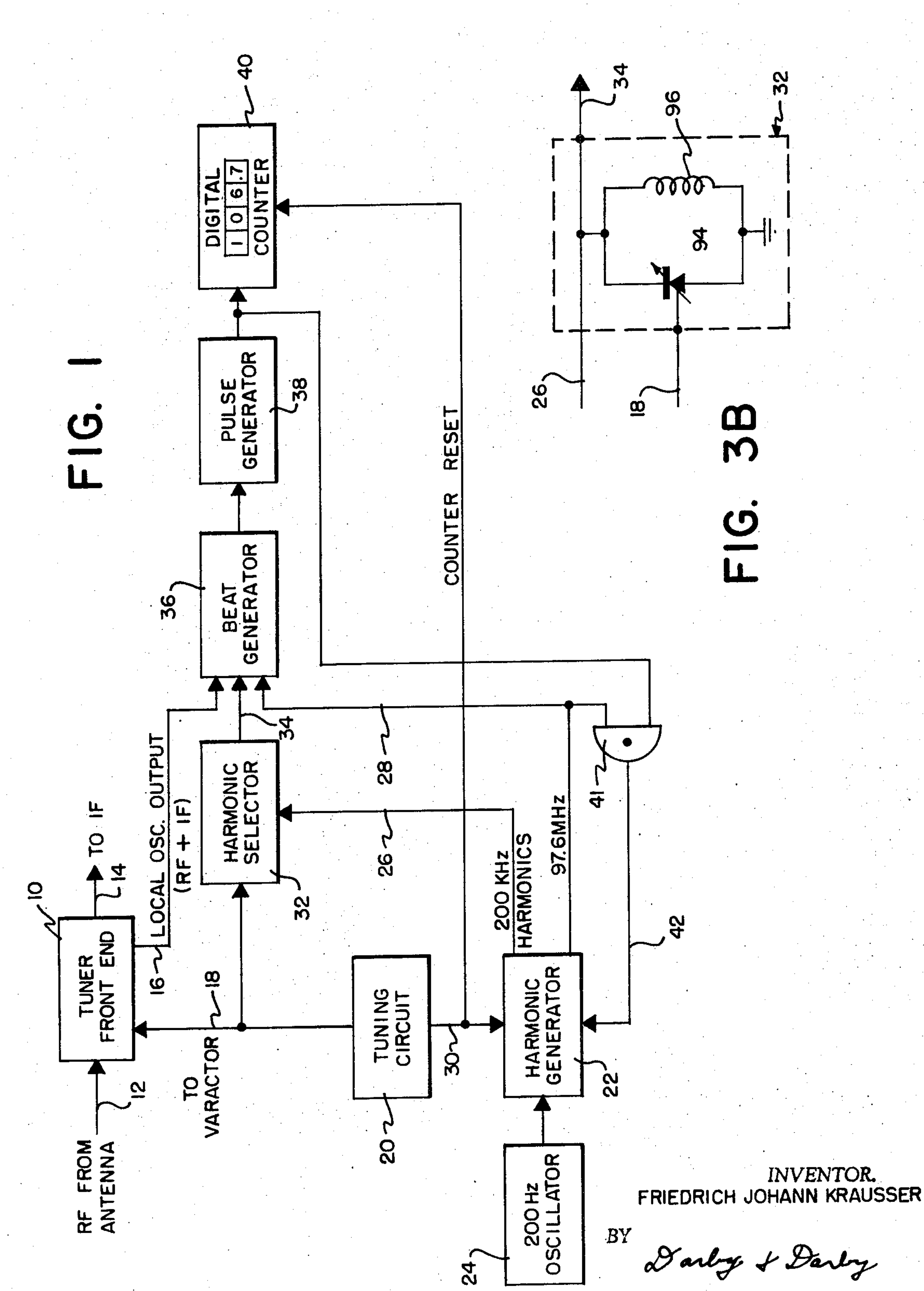
FIG. 1 is a block diagram of a preferred embodiment of the invention.
FIGS. 3A–3D are more detailed diagrams showing the construction of certain of the system "blocks" represented in FIG. 1.

FIG. 1 illustrates in block diagram form the invention as used with an FM multiplex receiver employing varactors as the tuning means. Since the construction of such receivers is well known, the circuits of the receiver are only shown diagrammatically. Thus, the tuner includes a front end section 10 which receives the radio frequency signals from an antenna via line 12. The front end section 10 typically includes an RF amplifier (not shown) and a variable frequency local oscillator (not shown) which produces an RF voltage to be mixed with the RF signal from line 12 to provide an intermediate frequency (IF) signal of constant frequency (10.7 MHz in the case of standard FM receivers). This IF signal contains the audio information and is coupled via line 14 to the IF sections of the receiver and the subsequent receiver IF and audio stages.

In the preferred embodiment of the invention, the front end section 10 includes a varactor as the means for varying the frequency of the local oscillator referred to above. The output of the local oscillator, shown diagrammatically at 16, consists of a variable frequency signal which is equal to the sum of the fixed intermediate frequency and the radio frequency to which it is desired to tune the receiver. The oscillator frequency is determined by the magnitude of a direct voltage applied to line 18 which is coupled to a varactor (not shown) within the oscillator tank circuit. As an example, the voltage applied to line 18 may be provided by a tuning circuit 20 as shown in the aforementioned U.S. patent application Ser. No. 82,400. This voltage, as is known, is a voltage which increases with increasing frequency over the band of interest. In other words, as the voltage on line 18 is increased, the capacitance of the varactor is changed (decreased) to increase the frequency to which the oscillator is tuned. The operation of the tuner front end 10 as described is conventional.

In commercial FM radio in the United States, the frequency band is between 88 MHz and 108 MHz with stations being separated by 200 KHz. A digital tuning indicator must be capable of providing an indication for any station between those two extremes. According to the invention, a harmonic generator 22 is responsive to a 200 KHz oscillator 24. Harmonic generator 22 provides outputs on lines 26 and 28 in response to a control signal on line 30 from the tuning circuit 20 and line 42 as described in further detail below. The signal on line 26 contains all harmonics over the frequency band of interest, that is, there is an alternating voltage of a frequency corresponding to each individual station in the entire FM band. The signal on line 28 is a 97.6 MHz signal which, as explained in the following, serves to reset accurately the indicator means when the tuning voltage is switched from a value corresponding to the high end of the FM band to a value corresponding to the low end.

The harmonic output on line 26 is coupled to a harmonic selector 28 which receives on a second input the tuning voltage on line 18 provided by the tuning circuit 20. As described below, harmonic selector 32 produces an output on line 34 which contains only the single harmonic corresponding to the local oscillator frequency of the station to which the front end 10 is tuned. In other words, if the local oscillator of front end 10 has been tuned to 99.8 MHz (89.1 + 10.7), only the 99.8 MHZ harmonic from line 26 is coupled to line 34. All other harmonics on line 26 are suppressed.

A beat generator 36 mixes the input signals applied to it on lines 16 and 34 or on lines 16 and 28. During the normal tuning operation, the 97.6 MHz signal on line 28 is disabled. During the counter reset period, described below, the 97.6 MHz signal is applied to line 28 while the harmonic signal on line 26 is disabled so that at any given time the local oscillator output on line 16 is only compared to the frequency on line 34 or the frequency on line 28.

Beat generator 36 mixes or heterodynes whichever two input signals are applied and produces at its output difference (and sum) signals as is inherent in all mixers. These difference signals are coupled to a pulse generator 38 which operates a digital counter 40 to provide the desired indication. Pulse generator 38 includes a 100 Hz (for example) low-pass filter (not shown) so that it can provide a pulse whenever the signals being mixed by beat generator 36 are within 100 Hz (for example) of each other. Thus, as the device is tuned, each time the receiver is tuned to a frequency within 100 Hz of a station within the FM band, a pulse is provided by pulse generator 38 to actuate digital counter 40. Counter 40 is calibrated to count in steps of 200 KHz (0.2 HMz) so that as each station is reached, the counter indication will advance to a number corresponding to the frequency of that station.

The tuning voltage applied to line 18 by the tuning circuit 20 is a voltage which increases as the tuned frequency increases. When the highest station in the band is reached, the tuning voltage on line 18 drops abruptly to a low voltage corresponding to the lowest station to be received within the band. For example, the tuning voltage may switch abruptly from a high voltage corresponding to 107.9 MHz to a low voltage corresponding to 86.9 MHz (or less). When this occurs, the tuning circuit 20 applies a control signal to line 30 which, as indicated above, (a) causes the digital counter 40 to be reset to 86.7; (b) disables the harmonic line 26 from generator 22; and (c) couples a 97.6 MHz signal to beat generator 36 via line 28. Consequently, during reset, the 97.6 MHz signal is compared directly with the local oscillator output on line 16 from the tuner front end 10. When the tuning voltage on line 18 applied to the varactor which tunes the local oscillator reaches a value at which the local oscillator frequency is approximately equal to 97.6 MHz, the beat generator 36 and pulse generator 38, operating as explained previously, actuate digital counter 40, causing it to advance a count of 0.2 from its reset count of 86.7 to 86.9. At this point, the indicator is correctly calibrated. The digital number indicated (86.9) by counter 40 corresponds to the local oscillator frequency of 97.6 MHz (86.9 + 10.7 MHz).

As diagrammatically shown in FIG. 1, the first count after reset is used to disable line 28 and apply the harmonic signal to line 26. Thus, an AND gate 41, responsive to a signal from pulse generator 38 when line 28 is enabled, applies a suitable control signal to harmonic generator 22 via line 42 for this purpose.

Subsequently, as the tuning voltage on line 18 increases to increase the tuned frequency, the indicator operates as explained above to provide a continuous digital indication of the frequency corresponding to the station to which the receiver is tuned.

Figures 2, 3A:
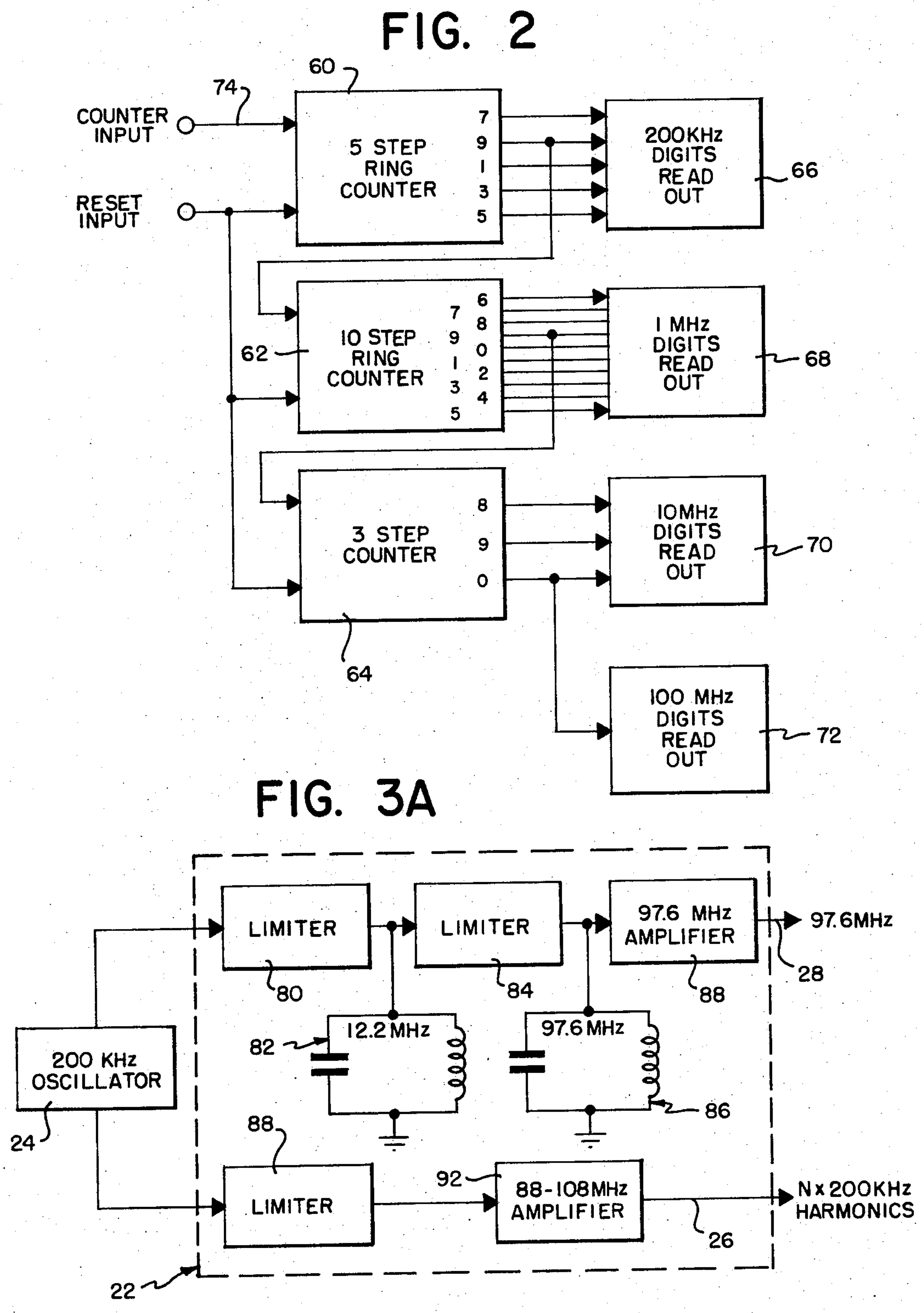
FIG. 2 is a block diagram of the counter showing how the various stages are connected to provide an indicator for use with an FM receiver.

A preferred embodiment of a digital counter 40 is illustrated in block diagram form in FIG. 2 although the construction of the counter per se does not form a part of this invention. Counter 40 consists of a five-step ring counter 60, a 10-step ring counter 62, and a three-step counter 64. Each counter is shown as including a plurality of output lines identified by numbers which also indicate the corresponding counter stage. The input to each is shown in the upper left-hand corner. One output line at a time is energized depending upon the count stored in the counter. The three counters are cascaded in a standard fashion with the "9" output of counter 60 coupled to the input of counter 62 and the "9" output of counter 62 coupled to the input of counter 64. The outputs of counters 60, 62 and 64 are coupled to respective indicators 66, 68 and 70. The third or last output line from counter 64 is also coupled to a 100 MHz indicator 72.

The indicators 66, 68, 70 and 72 may be standard display devices (such as "Nixie" tubes) which will provide an indication of a digit corresponding to the input line energized by the associated counter. Counter 66 corresponds to the 200 KHz (0.2 MHz) digit, indicator 68 to the 1 MHz digit, indicator 70 to the 10 MHz digit, and indicator 72 to the 100 MHz digit.

When the counter is reset, it is reset to 86.7 (which is below the lowest station in the FM band). In this condition, the "7", "6" and "8" output lines of the respective counters 60, 62 and 64 are energized. When the first pulse is applied to the input terminal 74, counter 60 advances a count of one, thus removing the energizing signal from its output line "7" and applying it to the output line "9." Each successive pulse is similarly counted. When the "9" output changes from an energized condition to a de-energized condition, it applies an input pulse to 10-step ring counter 62, removing the energizing signal from output line "6" and applying it to line "7." Hence, for each five input pulses, the 10-step counter 62 is stepped one. In a similar way, counter 64 is stepped after the counter 62 has been stepped four times and, thereafter, after the receipt of every 10 input pulses by counter 62. When the "0" output of counter 64 is energized, indicator 70 will provide a "0" indication and indicator 72 a "1" indication.

Harmonic generator 22 may take many different forms. A preferred embodiment of this generator is illustrated in block diagram form in FIG. 3A. As indicated in FIG. 1, generator 22 is driven by the 200 KHz oscillator 24. It may include a limiter 80 which operates in a well-known fashion to provide a signal rich in harmonics. A tank circuit 82 resonant to 12.2 MHz is connected across the output of limiter 80 to couple a 12.2 MHz sine wave to the input of a second limiter 84. This second limiter further "multiplies" the input frequency by providing still more subharmonics. A second tank circuit 86 resonant to 97.6 MHz provides a 97.6 MHz signal which may be amplified by an amplifier 88 before it is applied to line 28.

The 200 KHz harmonics are similarly provided by a limited 90 and an 88–108 MHz band-pass amplifier 92. Amplifiers 88 and 92 may be responsive to the control signals on lines 30 and 42 to connect (or disconnect) their associated inputs to (or from) lines 28 and 26, respectively.

The control signal on line 30 may be generated in a number of ways. A simple way would be to have a pulse generating means (not shown) responsive to the steep negative-going voltage during the reset period provide a pulse on line 30 which, simultaneously,would enable the amplifier 88 in the 97.6 MHz train while disabling the amplifier 92. The pulse generating means and amplifiers required for this purpose are believed to be well within the capability of a person of ordinary skill in the electronic arts and therefore are not described herein in detail.

A preferred harmonic selector 32 is shown in FIG. 3B. It comprises a varactor 94 shunt-connected with an inductance 96 to provide a variable frequency tank circuit. Varactor 94 matches the varactor used to vary the frequency of the local oscillator (i.e., for any given voltage, the capacitance of both varactors is the same). Consequently, the inductance 96 can be chosen so that for any tuning voltage, the tank circuit is resonant to the frequency of the local oscillator. As a result, the tank circuit shorts all harmonics to ground except the harmonic having the frequency of the local oscillator, which appears on line 34 across the tank circuit. In this way, the desired harmonic is selected.

Figure 3C:
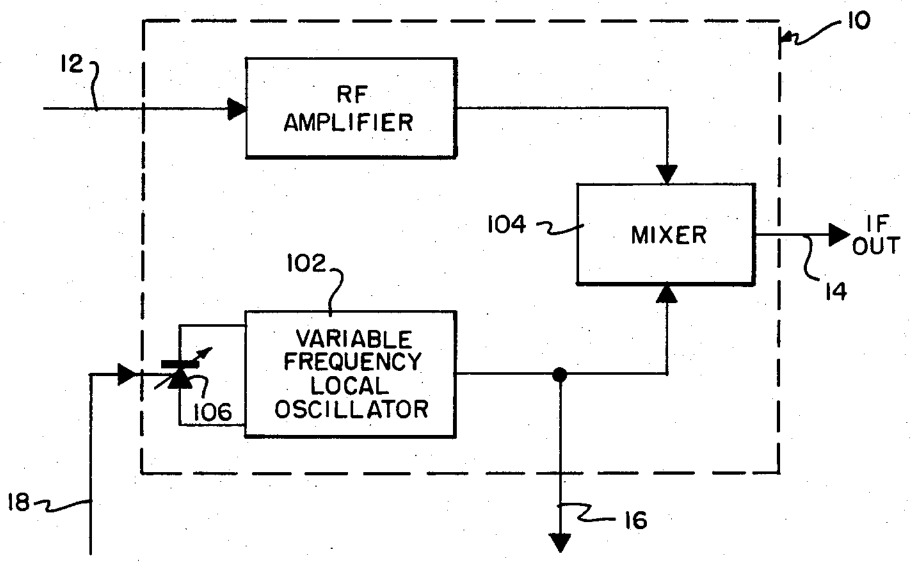
Figure 3D:
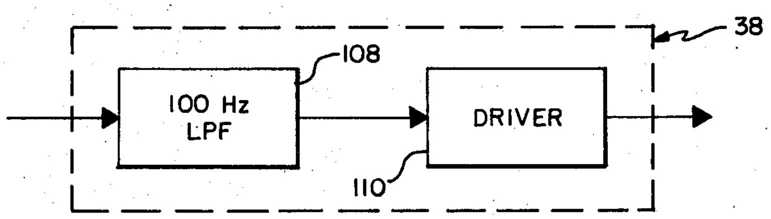

The components of the tuner front end 10 are shown in FIG. 3C. They include RF amplifier 100, variable frequency local oscillator 102 and mixer 104. The frequency of local oscillator 102 is determined by the capacitance of varactor 106, which, in turn, depends on the voltage applied thereto by line 18. The operation of front end 10 is conventional and has been described. FIG. 3D diagrammatically shows the parts of pulse generator 38. They include a 100 Hz low-pass filter 108 and a driver or amplifier 110 for energizing counter 40.

The invention, as described in its preferred embodiment, is of particular utility in conjunction with a receiver which employs a fully electronic tuning system. However, as noted previously, the basic principles of the invention could be employed with mechanical tuning devices and with transmitters as well as receivers. Obviously, the frequency range is not a material consideration. The principal advantages of the invention reside in its accuracy and its potential commercial application by virtue of its relatively low cost as compared to digital indicators employing costly frequency counters.

What is claimed is:

1. A digital tuning indicator for use with electronic apparatus which is tunable over a preselected frequency band, the carrier frequencies of said band being spaced by at least N cycles per second, said apparatus including a voltage variable capacitor for tuning the apparatus to a selected one of said frequencies in response to a variable voltage, comprising an oscillator having an output frequency of K cycles per second, a harmonic generator responsive to said oscillator for producing harmonics spaced N cycles per second apart throughout said band, a beat generator, harmonic selector means for coupling the harmonic corresponding to the frequency to which the apparatus is tuned to an input of said beat generator when the apparatus is tuned to one of said carrier frequencies, means for coupling a variable frequency signal to another input of said beat generator, the frequency of said variable frequency signal corresponding to the frequency to which said apparatus is tuned, said beat generator producing a signal having a frequency equal to the frequency difference between the input signals applied thereto, means responsive to the output of said beat generator for producing a pulse when said frequency difference is less than a preselected amount, digital counter means for counting said pulses, said counter means being calibrated to provide a visual indication of the frequency to which said apparatus is tuned, and means for resetting said counter when said tuning voltage switches from a voltage corresponding to the high end of the frequency band to a voltage corresponding to the low end of said frequency band.

2. A digital tuning indicator according to claim 1, including means for producing a voltage having a preselected frequency corresponding to the lowest frequency to be indicated, and means for coupling said voltage in place of said selected harmonic to said beat generator after said counter has been reset.

3. A digital tuning indicator according to claim 1, wherein said harmonic selector means also includes a voltage-variable capacitor connected in parallel with an inductance to provide a tunable tank circuit, and means for applying said tuning voltage across said tank circuit.

4. A digital tuning indicator according to claim 3, wherein said pulse generator means includes a low-pass filter for producing an output when said frequency difference is equal to or less than said preselected amount.

5. A digital tuning indicator according to claim 2, wherein said pulse generator means includes a low-pass filter for producing an output when said frequency difference is equal to or less than said preselected amount.

6. A digital tuning indicator for use with electronic apparatus which is tunable over a preselected frequency band, said apparatus including tuner means for tuning the apparatus to one of a selected number of frequencies within said band, means for producing a plurality of signals having respective frequencies equal to said selected frequencies, a beat generator, means for coupling the signal having a frequency corresponding to the frequency to which the apparatus is tuned to an input of said beat generator when said apparatus is tuned to one of said selected frequencies, means for coupling a variable frequency signal to another input of said beat generator, the frequency of said variable frequency signal corresponding to the frequency to which said apparatus is tuned, said beat generator producing a signal having a frequency equal to the frequency difference between the input signals applied thereto, means responsive to the output of said beat generator for producing a pulse when said frequency difference is reduced to a preselected amount, digital counter means for counting said pulses, said counter means being calibrated to provide a visual indication of the frequency to which said apparatus is tuned, means for resetting said counter after the apparatus is tuned to the lowest frequency in said band, means for producing a voltage having a preselected frequency corresponding to the lowest frequency to be indicated, and means for coupling said voltage in place of said frequency corresponding signal to said beat generator after said counter has been reset.

* * * * *